US007949977B2

(12) United States Patent
Kouzaki et al.

(10) Patent No.: US 7,949,977 B2
(45) Date of Patent: May 24, 2011

(54) METHOD AND DEVICE FOR ESTIMATING SIMULTANEOUS SWITCHING NOISE IN SEMICONDUCTOR DEVICE, AND STORAGE MEDIUM

(75) Inventors: Yasuo Kouzaki, Kawasaki (JP); Shinichiro Uekusa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 681 days.

(21) Appl. No.: 11/882,293

(22) Filed: Jul. 31, 2007

(65) Prior Publication Data
US 2008/0027662 A1 Jan. 31, 2008

Related U.S. Application Data

(63) Continuation-in-part of application No. 11/604,729, filed on Nov. 28, 2006, now abandoned.

(30) Foreign Application Priority Data

Jul. 31, 2006 (JP) ................................. 2006-209098
Apr. 27, 2007 (JP) ................................. 2007-120060

(51) Int. Cl.
*G06F 17/50* (2006.01)
(52) U.S. Cl. ........ 716/115; 716/106; 716/109; 716/110; 716/111; 716/119
(58) Field of Classification Search .................. 716/4–6, 716/10, 16, 106, 109, 110, 111, 113, 115, 716/119
See application file for complete search history.

(56) References Cited

U.S. PATENT DOCUMENTS

| 5,477,460 | A  | * | 12/1995 | Vakirtzis et al. | 716/5 |
| 6,564,355 | B1 | * | 5/2003  | Smith et al. | 716/4 |
| 7,139,691 | B1 | * | 11/2006 | Duong | 703/19 |
| 7,412,673 | B1 | * | 8/2008  | Duong | 716/4 |
| 7,523,430 | B1 | * | 4/2009  | Patel | 716/10 |

FOREIGN PATENT DOCUMENTS

JP     2000-285146     10/2000

\* cited by examiner

*Primary Examiner* — Paul Dinh
*Assistant Examiner* — Nha T Nguyen
(74) *Attorney, Agent, or Firm* — Kratz, Quintos & Hanson, LLP

(57) ABSTRACT

The method comprises a number of simultaneously switching signals calculation step in which the number of simultaneously switching signals is calculated for each set of user setting information for the input and output signal on the basis of pin arrangement information and the user setting information of the pins in a neighboring area of a pin to be executed in the estimation process; and a simultaneous switching noise calculation step in which a difference is calculated between noise corresponding to an initial point and that to a terminal point in a range of the number of simultaneously switching signals calculated for each set of user setting information on the basis of a relationship between the number of simultaneously switching signals and the noise caused by the number of simultaneously switching signals for each set of user setting information.

14 Claims, 14 Drawing Sheets

| COLUMN | ROW | 10 USER SETTING INFORMATION | | |
|---|---|---|---|---|
| 1 | 1 | A | | |
| 1 | 2 | B | | |
| ⋮ | ⋮ | ⋮ | | |

FIG. 5

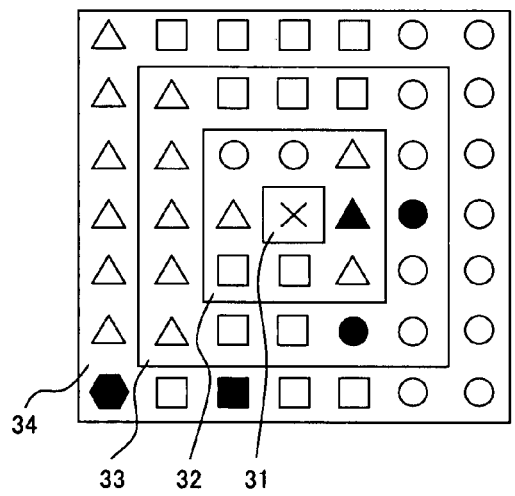
× : PROCESS-TARGET PIN
○ : IO USER SETTING INFORMATION A (IN PHASE/ASYNCHRONOUS)
△ : IO USER SETTING INFORMATION B (IN PHASE/ASYNCHRONOUS)
□ : IO USER SETTING INFORMATION C (IN PHASE/ASYNCHRONOUS)
● : IO USER SETTING INFORMATION A (OUT OF PHASE)
▲ : IO USER SETTING INFORMATION B (OUT OF PHASE)
■ : IO USER SETTING INFORMATION C (OUT OF PHASE)
⬢ : NOT USED
F I G. 1 1

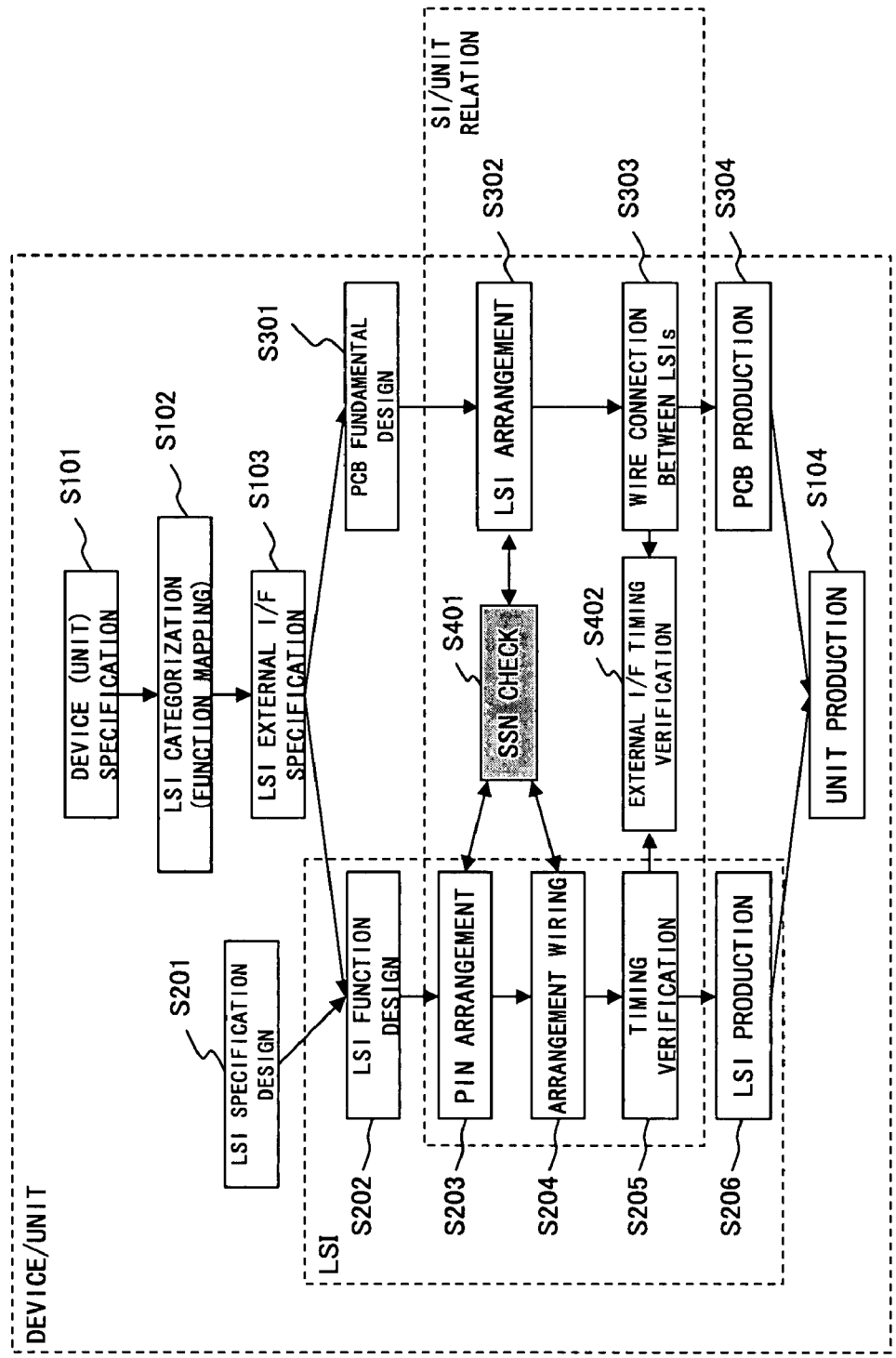
F I G. 12

US 7,949,977 B2

METHOD AND DEVICE FOR ESTIMATING SIMULTANEOUS SWITCHING NOISE IN SEMICONDUCTOR DEVICE, AND STORAGE MEDIUM

CROSS-REFERENCE TO RELATED APPLICATIONS

This application is a Continuation-in-Part Application of U.S. patent application Ser. No. 11/604,729, filed Nov. 28, 2006 now abandoned which application claims priority under 35 USC 119 of Japanese Application No. 2006-209098, filed Jul. 31, 2006,both of which are incorporated herein by reference.

This application further claims priority under 35 USC 119 of Japanese Application No. 2007-120060, filed Apr. 27, 2007, which is incorporated herein by reference.

BACKGROUND OF THE INVENTION

1. Field of the Invention

The present invention relates to a technique of estimating a simultaneous switching noise (SSN) (also referred to as simultaneous switching output (SSO) noise) caused by simultaneous switching of signals input into and output from a plurality of pins in a semiconductor device.

2. Description of the Related Art

An FPGA (Field Programmable Gate Array) is a semiconductor device that allows a user to set any pin arrangement, circuit configuration, and the like.

With an increase in the number of IO pins and the operation speed of circuits in the FPGA, simultaneous switching noise that is caused by the simultaneous switching of signals output from a large number of output pins can no longer be neglected.

Conventionally, ground bouncing occurring between reference levels of a ground pin in a device package and the ground of an internal die in the device has been one of the main causes of erroneous switching in high-speed devices. The erroneous switching can be caused by only one signal line; thus, when there is a plurality of lines for signals that switch simultaneously, any noise that they can cause is a serious problem.

Therefore, in a board including an FPGA, it is necessary to estimate the level of simultaneous switching noise on the basis of the pin arrangement of the FPGA via a simulation during a design phase in order to cause the FPGA device to operate appropriately.

In the case when a simulator such as, for example, a SPICE or the like is used, the simultaneous switching noise can be estimated relatively accurately. However, this method of simulation takes a long time.

Japanese Patent Application Publication No. 2000-285146 (referred to as Patent Document 1 hereinafter) discloses a technique of suppressing noise caused in branch power source lines. In this technique, a plurality of logic cells connected to one branch power source line are categorized into one arrangement of a logic cell group, the value of simultaneous switching noise that is expected to be caused by the simultaneous switching of a plurality of logic cell groups is obtained on the basis of a noise value for each arrangement of a logic cell, and the delay time of a plurality of delay adjustment buffers inserted into the logic cell group is adjusted on the basis of the comparison result between the total value of noise limitation value of the plurality of logic cell groups constituting the logic cell group arrangement and the expected simultaneous switching noise value.

SUMMARY OF THE INVENTION

It is an object of the present invention to provide a technique by which the noise caused by the input/output signals being simultaneously input into and output from a plurality of pins included in a semiconductor device can be estimated simply (promptly). A method of estimating simultaneous switching noise according to a first aspect of the invention is a method of estimating simultaneous switching noise that is realized by a computer executing a process of estimating simultaneous switching noise caused by the simultaneous switching of signals input into and output from a plurality of pins that can be set by a plurality of sets of user signal setting information in a semiconductor device, comprising: a number of simultaneously switching signals calculation step for each set of user setting information in which the number of simultaneously switching signals is calculated on the basis of the user setting information of pins arranged in an area of the neighborhood of a process-target pin; a difference calculation step in which a difference is calculated between instances of noise respectively corresponding to an initial point and a terminal point in a range of the number of simultaneously switching signals calculated for each set of user setting information on the basis of caused noise information expressing a relationship between the number of simultaneously switching signals and the noise caused by the simultaneously switching signals for each set of user setting information that is stored in a storage unit of the computer; and a noise sum calculation step in which the simultaneous switching noise in the process-target pin is calculated by calculating the sum of the differences between the instances of noise calculated for the respective user setting information.

A method of estimating simultaneous switching noise according to a second aspect of the present invention is a simultaneous switching noise estimation method for estimating, by using a computer, simultaneous switching noise that is noise expected to be caused when input/output signals set by user setting information are respectively input into and output from a plurality of pins included in a semiconductor device, said method comprising: a number calculation step of calculating, on the basis of a pin selected from the plurality of pins to be the process-target pin, the number of other pins that are to be used for the estimation of the simultaneous switching noise as the number of simultaneously switching signals; and a noise calculation step of calculating simultaneous switching noise corresponding to the number of simultaneously switching signals calculated in the number calculation step, by referring to caused noise information stored in a storage unit in the computer to express a relationship between the number of simultaneously switching signals and noise expected to be caused.

A simultaneous switching noise estimation device according to the present invention is a simultaneous switching noise estimation device that executes a process of estimating the simultaneous switching noise caused by the simultaneous switching of signals input into and output from a plurality of pins that can be set by a plurality of sets of user setting information in a semiconductor device, comprising: a number of simultaneously switching signals calculation unit for calculating the number of simultaneously switching signals for each set of user setting information on the basis of the user setting information of pins arranged in an area of the neighborhood of a process-target pin; a storage unit for storing caused noise information expressing a relationship between the number of simultaneously switching signals and the noise caused by the simultaneously switching signals for each set of user setting information; a difference calculation unit for calculating the difference between instances of noise respectively corresponding to an initial point and a terminal point in a range of the number of simultaneously switching signals calculated for each set of user setting information on the basis of the caused noise information stored in the storage unit for each set of user setting information; and a noise sum calculation unit for calculating the simultaneous switching noise in the process-target pin by calculating the sum of the differences between the instances of noise calculated for the respective user setting information.

A storage medium according to the present invention is a storage medium that can be accessed by a computer performing a process of estimating simultaneous switching noise caused by the simultaneous switching of input/output signals of a plurality of pins that can be set by a plurality of sets of user setting information in a semiconductor device, said storage medium recording a program for realizing: a number of simultaneously switching signals calculation function by which the number of simultaneously switching signals is calculated for each set of user setting information on the basis of the user setting information of the pins arranged in an area in the neighborhood of a process-target pin; a difference calculation function by which a difference is calculated between instances of noise respectively corresponding to an initial point and a terminal point in a range of the number of simultaneously switching signals calculated for each set of user setting information on the basis of a caused noise information expressing a relationship between the number of simultaneously switching signals and the noise caused by the simultaneously switching signals for each set of user setting information; and a noise sum calculation function by which the simultaneous switching noise in the process-target pin is calculated by calculating the sum of the differences between the instances of noise calculated for the respective user setting information.

In the present invention, on the basis of the process-target pin, other pins that are to be used for the estimation of the simultaneous switching noise are specified, the number of specified pins are calculated as the number of simultaneously switching signals, caused noise information expressing a relationship between the number of simultaneously switching signals and noise caused by the simultaneously switching signals (noise expected to be caused) is referred to, the difference between the instances of noise corresponding to the numbers of the simultaneously switching signals is calculated, and the difference is integrated, thereby the simultaneous switching noise is calculated. Thereby, other pins are specified and the simultaneous switching noise is estimated on the basis of the specified other pins, and thereby the estimation can be performed in a short time.

Other pins are categorized into a plurality of groups on the basis of the magnitude of the simultaneous switching noise caused, the degree of influence of the noise, the input/output signals being input and output, and the like. Further, the caused noise information is created for each group. Thereby, the difference (noise) is obtained for each group, the obtained difference is integrated in order to calculate the simultaneous switching noise, and accordingly it is possible to estimate the simultaneous switching noise more accurately.

The estimation of the simultaneous switching noise can be performed in a short time, and thus it is possible to assist in the quick design/production of semiconductor devices or PCBs that include semiconductor devices. The simultaneous switching noise that is actually caused changes in accordance with changes in the design of one of the semiconductor devices and the PCB. Accordingly, when there is a fault in the design of one of the semiconductor devices and the PCB, that fault can be compensated by the design of the one not involving the fault. This compensation can be performed promptly because the estimation of the simultaneous switching noise can be performed in a short time.

BRIEF DESCRIPTION OF THE DRAWINGS

FIG. 5 shows a data configuration of the pin information storage unit shown in FIG. 1B;

FIG. 11 shows a method of grouping in a fourth embodiment;

FIG. 12 is a flowchart for designing for a case when the design of a semiconductor device and the design of PCBs are related.

DESCRIPTION OF THE PREFERRED EMBODIMENTS

Figure 1A:
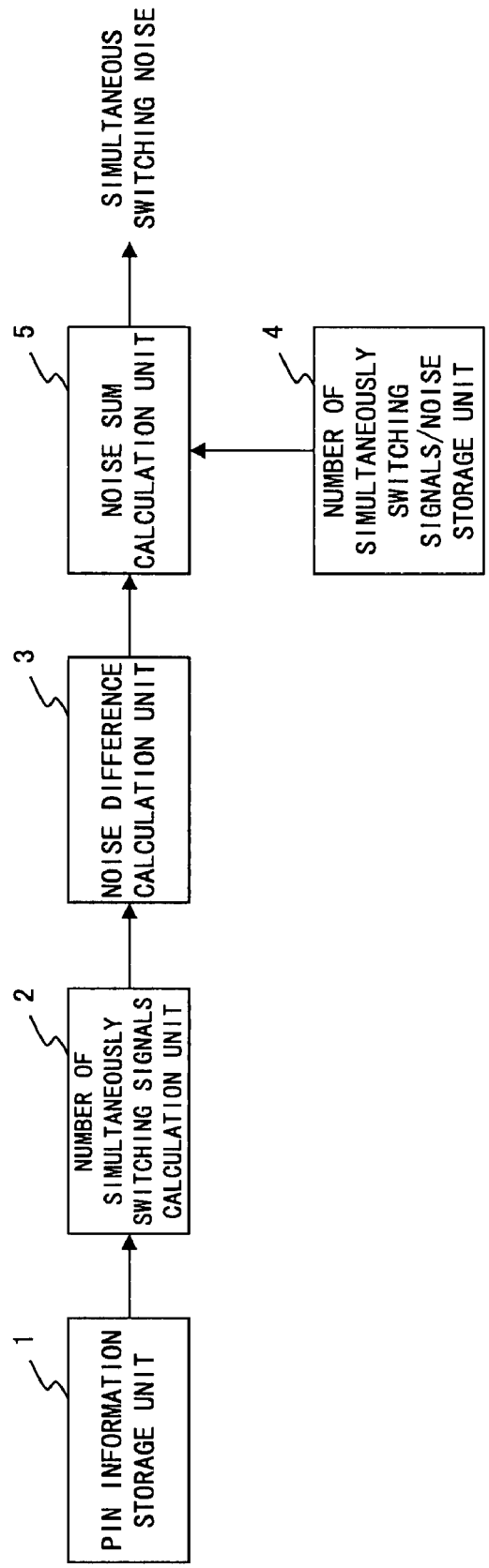
FIG. 1A shows a configuration of a simultaneous switching noise estimation device according to a first embodiment of the present invention.

Hereinafter, embodiments of the present invention will be explained in detail by referring to the drawings.

First Embodiment

The present invention relates to a technique of simply (promptly) estimating the simultaneous switching noise caused by the simultaneous switching of a plurality of input and output signals of a plurality of pins included in a semiconductor device.

FIG. 1A shows a configuration of a simultaneous switching noise estimation device according to a first embodiment of the present invention.

As shown in FIG. 1A, the simultaneous switching noise estimation device includes a pin information storage unit 1, a number of simultaneously switching signals (the number of pins) calculation unit 2, a noise difference calculation unit 3, a number of simultaneously switching signals/noise storage unit 4, and a noise sum calculation unit 5.

The pin information storage unit 1 stores pin arrangement information and information that is set by a user about the input/output (IO) signals of the pins (hereinafter, referred to as "IO user setting information") of the semiconductor device that is to be analyzed. The IO user setting information is information that can be set by a user about the IO signals such as the standard of the IO signals (LVTTL, LVCMOS, HSTL, and the like), the output current value (12 mA, 8 mA, 4 mA, or the like), the through rate (FAST/SLOW), and the like.

The number of simultaneously switching signals calculation unit 2 calculates the number of simultaneously switching signals for each set of IO user setting information on the basis of the pin arrangement information on an area around a pin that is to be analyzed (process-target pin) and on the basis of the IO user setting information on these pins.

The number of simultaneously switching signals/noise storage unit 4 stores information expressing the relationship (relation function, hereinafter referred to as "caused noise information") between the number of simultaneously switching signals and the noise caused by the simultaneously switching signals for each set of IO user setting information.

The noise difference calculation unit 3 associates, with the range of the number of simultaneously switching signals in the caused noise information, the number of pins (the number of simultaneously switching signals) calculated for the IO user setting information on the basis of the caused noise information stored for each set of IO user setting information stored in the number of simultaneously switching signals/ noise storage unit 4 in order to calculate the difference between the instances of noise that respectively correspond to the initial point and the terminal point in the range.

The noise sum calculation unit 5 calculates the simultaneous switching noise caused in the pin that is to be analyzed by calculating the sum of the differences between the instances of noise calculated for the respective sets of IO user setting information.

As described above, the simultaneous switching noise (amount) that is expected to be caused in the pins as the process targets is obtained by defining the method of extracting other pins that have to be considered for the noise estimation, and the relationship between the number of pins (the number of simultaneously switching signals) and the noise expected to be caused before the obtainment. Thereby, the noise can be estimated quickly.

Second Embodiment

Figure 1B:
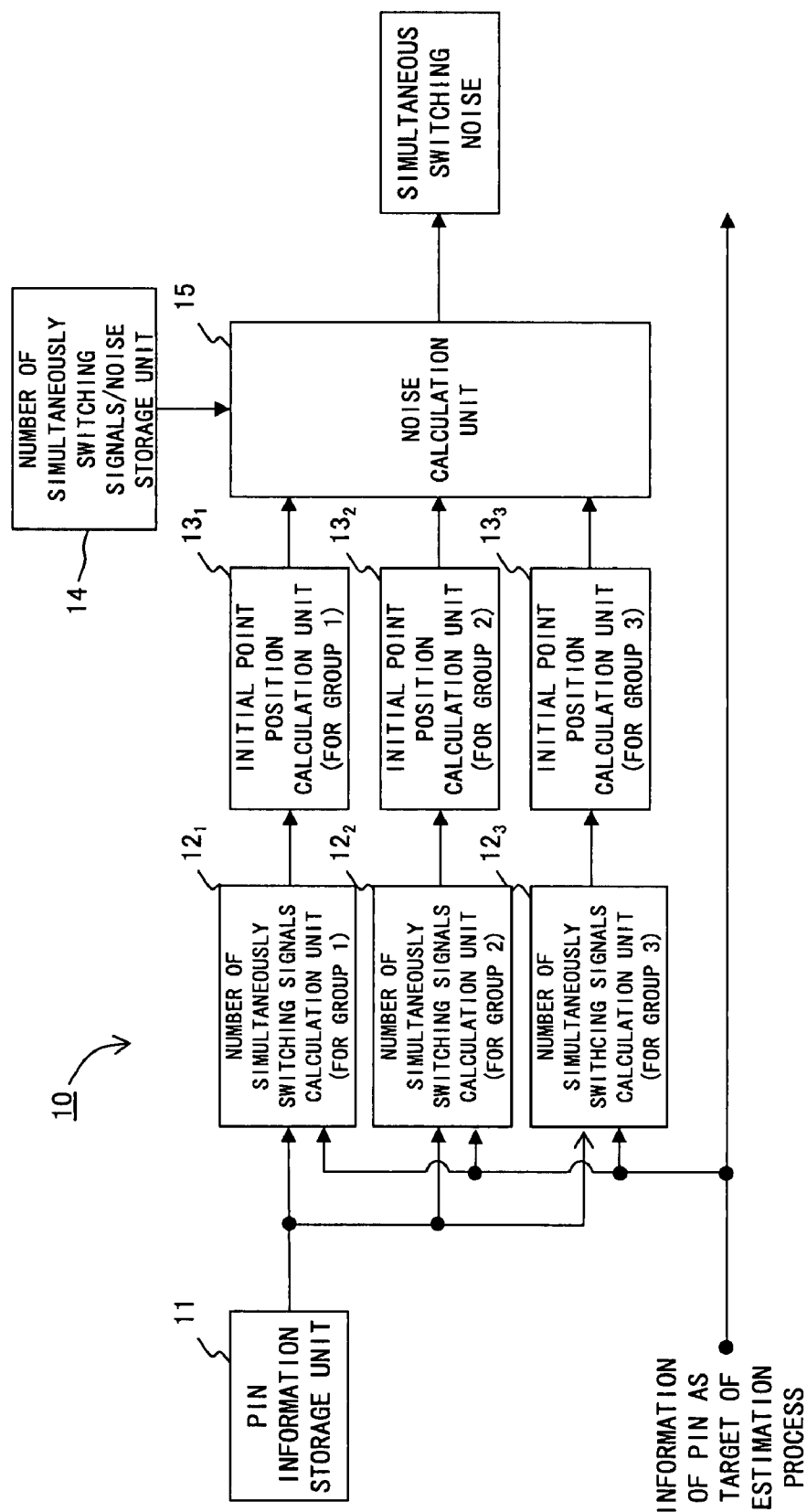
FIG. 1B is a block diagram showing a configuration of a simultaneous switching noise estimation device according to a second embodiment of the present invention.

FIG. 1B is a block diagram showing a configuration of a simultaneous switching noise estimation device according to a second embodiment of the present invention.

As shown in FIG. 1B, a simultaneous switching noise estimation device 10 includes a pin information storage unit 11, the number of simultaneously switching signals (the number of pins) calculation units $12_1$, $12_2$, and $12_3$, initial point position calculation units $13_1$, $13_2$, and $13_3$, the number of simultaneously switching signals/noise storage unit 14, and a noise calculation unit 15.

The pin information storage unit 11 stores pin arrangement information for each pin of a semiconductor device that is to be analyzed and the IO user setting information as pin information.

The number of simultaneously switching signals calculation unit $12_1$ extracts the pin arrangement information and the IO user setting information of pins arranged in an area for at most eight pins, that are the closest to the target pin (the pins included in this area are referred to as the pins included in a group 1) by using the pin information of the target pin, and the number of pins for each set of IO user setting information, i.e., the number of simultaneously switching signals, is calculated on the basis of the extracted information.

The number of simultaneously switching signals calculation unit $12_2$ extracts the pin arrangement information and the IO user setting information of the pins arranged in an area around the above area that includes at most sixteen pins (the pins included in this area are referred to as the pins included in group 2) for at most the closest eight pins by using the pin information of the target pin, and the number of pins in group 2 and for each set of IO user setting information is calculated on the basis of the extracted information.

The number of simultaneously switching signals calculation unit $12_3$ extracts the IO user setting information and the pin arrangement information for at most twenty-four pins arranged in an area around above area that includes at most sixteen pins (the pins included in this area are referred to as the pins included in group 3) by using the information of the target pin, and the number of pins for each set of IO user setting information in the area including the at most twenty-four pins is calculated on the basis of the extracted information.

The initial point position calculation units $13_1$, $13_2$, and $13_3$ receive at least one set of information that includes the IO user setting information and the number of pins from the number of simultaneously switching signals calculation units $12_1$, $12_2$, and $12_3$ respectively, and adds, to the received set of information, the initial point position corresponding to the number of pins, i.e., corresponding to the number of simultaneously switching signals. Then, the initial point position calculation units $13_1$, $13_2$, and $13_3$ respectively output, to the noise calculation unit 15 in a later stage, a set of data including the IO user setting information, the number of pins, and the initial point position. The initial point position is the range width of the number of simultaneously switching signals calculated for each set of user setting information of input/ output signals. In other words, it is the number of simultaneously switching signals from the origin that is required for determining the position of the initial point of the range in the direction of the increasing number of simultaneously switching signals SW (from zero to a, from a to a+b, from a+b to a+b+c) and for determining the position of the terminal point (zero, a, and a+b) in FIG. 2.

That is, the initial point position calculation unit $13_1$ calculates the number of pins for each set of IO user setting information in the area including the eight pins that are the closest to the target pin, i.e., calculates the initial point position corresponding to the number of simultaneously switching signals for each set of IO user setting information.

The initial point position calculation unit $13_2$ calculates the number of pins for each set of IO user setting information in the area including the sixteen pins that are the second closest to the target pin, i.e., calculates the initial point position that is recognized as the number of simultaneously switching signals.

The initial point position calculation unit $13_3$ calculates the initial point position used for causing the number of pins for each set of IO user setting information in the area including the twenty-four pins that are the third closest to the target pin to correspond to the number of simultaneously switching signals.

The number of simultaneously switching signals/noise storage unit 14 stores the caused noise information that expresses the relationship between the number of simultaneous switching signals and the noise that is expected to be caused by the simultaneous switching for each set of IO user setting information.

The noise calculation unit 15 refers to the caused noise information stored in the number of simultaneously switching signals/noise storage unit 14, assumes the number of pins calculated for each set of IO user setting information (a, b, and c in FIG. 2) and the initial point position (zero, a, and a+b in FIG. 2) to be the number of simultaneously switching signals, and calculates the difference between the noise corresponding to the "the number of pins+the initial point position" and the noise corresponding to the initial point position. The number of simultaneously switching signals/noise storage unit 14 also calculates the simultaneous switching noise of the target pins by calculating the sum of the differences between the instances of noise calculated for the respective sets of IO user setting information.

It is also possible to compare the simultaneous switching noise that is calculated for each target pin with the limit value of the noise that is tolerated as a design specification.

Figure 2:
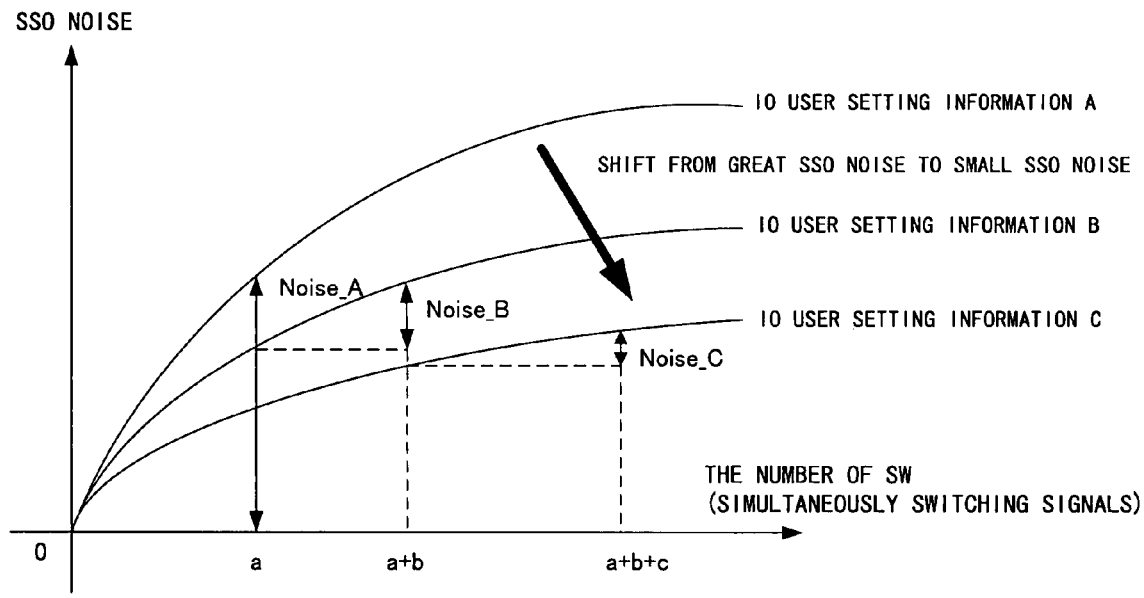
FIG. 2 is a graph illustrating a relationship between the number of simultaneous switching signals and the noise that is expected to be caused expressed by caused noise information for each IO user setting information.

FIG. 2 is a graph illustrating a relationship between the number of simultaneous switching signals and the noise expected to be caused expressed by the caused noise information; the caused noise information (graph) for each set of IO user setting information is stored in the number of simultaneous switching signals/noise storage unit shown in FIG. 1B. The horizontal axis represents the number of simultaneously switching signals, and the vertical axis represents the noise expected to be caused (specifically, for example, the variation amount of the voltage level, the voltage ratio between the IO signal and the noise expected to be caused, or the like; here, the example of the variation amount [V] of the voltage level is used).

In FIG. 2, "IO user setting information A" is information used for recognizing a combination of the standard of an IO signal, an output current value, and a through rate, and "IO user setting information B" is information used for recognizing another combination of the standard of an IO signal, an output current value, and a through rate.

The pins located in the neighborhood of the target pin are categorized into a plurality of groups in accordance with the degrees (coupling coefficient) to which these pins influence the target pin (the distances between these pins and the target pin).

As shown in FIG. 2, the caused noise information for each IO user setting information has, as the actually measured data, data for the simultaneous switching noise with respect to the total value of the number of pins included in each group and included in the groups closer to the target pin than the group itself (the number of simultaneously switching signals corresponding to the total value).

Figure 3:
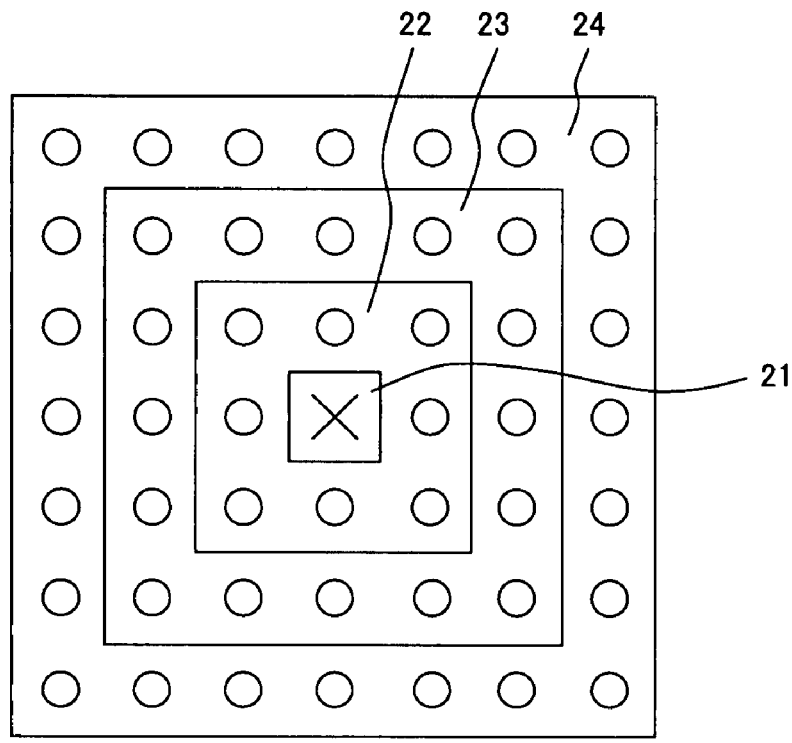
FIG. 3 shows an example of categorization.

As an example of the above categorization, the eight pins shown in area 22 around the target pin shown in area 21 are categorized into the pins included in group 1, the sixteen pins shown in area 23 in which is the area around the above area including the eight pins are categorized into the pins included in group 2, and the twenty-four pins shown in area 24 which is the area around the above area including sixteen pins are categorized into the pins included in group 3 in FIG. 3.

In the above case, the total value of the number of pins included in group 1 is eight, the total value of the number of pins included in group 2 and included in the group closer to the target pin than group 2 itself is twenty four (8+16=24), and the total value of the number of pins included in group 3 and included in the groups closer to the target pin than group 3 itself is forty-eight (8+16+24=48).

In the case when, for example, the eight pins in group 1 have common IO user setting information and the IO signals are switched in accordance with the same setting information, the simultaneous switching noise data is acquired.

The data of the simultaneous switching noise is acquired also when the twenty-four pins consisting of the eight pins in group 1 and the sixteen pins in group 2 have common IO user setting information and the IO signals are switched in accordance with the same setting information.

The data of the simultaneous switching noise is acquired also when the forty-eight pins consisting of the eight pins in group 1, the sixteen pins in group 2, and the twenty-four pins in group 3 have the common IO user setting information and the IO signals are switched in accordance with the same setting information.

Figure 4:
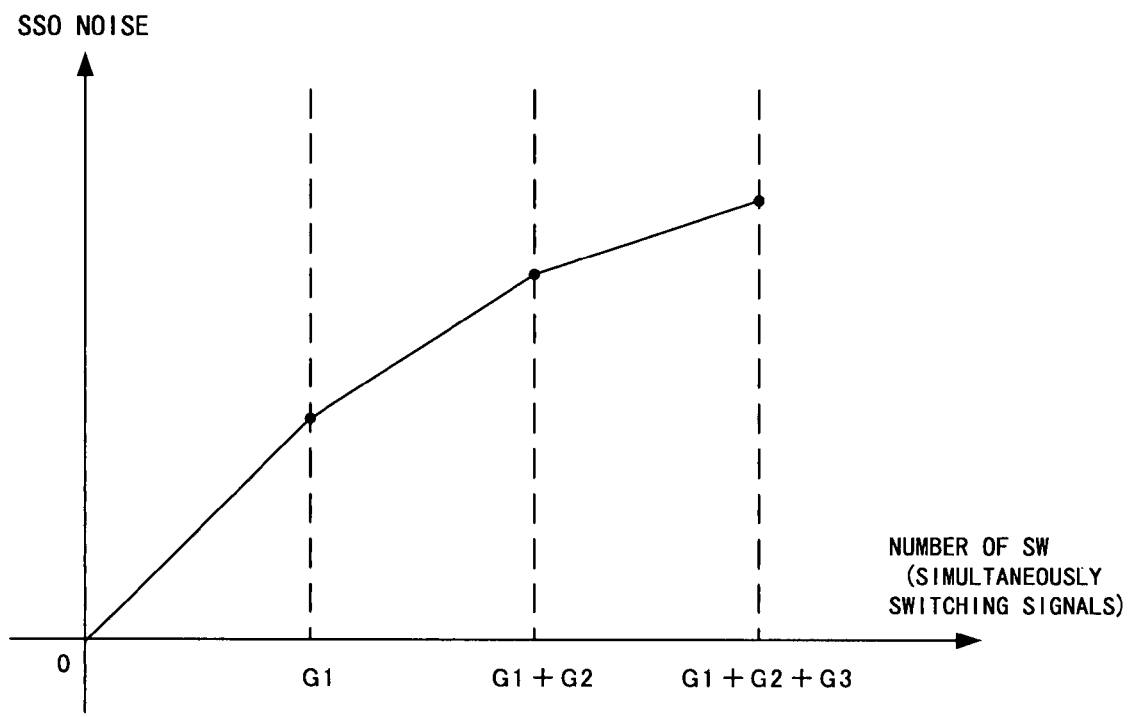
FIG. 4 is a graph illustrating a relationship between the number of simultaneously switching signals and the noise expressed by the caused noise information of one of IO user setting information.

The result, the caused noise information having the contents shown in FIG. 4 is obtained with IO user setting information by interpolating the data acquired as above (the number of simultaneously switching signals and the simultaneous switching noise).

In the graph shown in FIG. 4, the respective total numbers of simultaneously switching signals each corresponding to the total value of the number of pins included in each group and included in the groups closer to the target pin than the group itself are represented by G1, by G1+G2, and by G1+G2+G3 instead of 8, 8+16, and 8+16+24 because the pins may be categorized for example on the basis of the distances between the pins on a smaller scale.

FIG. 2 will be explained again.

In FIG. 2, the value a on the axis of the number of simultaneous switching signals (the number of SW) "a" represents the number of pins having the IO user setting information A in a group. The value b on the axis of the number of simultaneous switching signals (the number of SW) "b" represents the number of pins having the IO user setting information B in that group. The value c on the simultaneous switching signals (the number of SW) "c" represents the number of pins having the IO user setting information C in that group.

In the example of FIG. 2, the largest noise with respect to the number of simultaneously switching signals is caused with the IO user setting information A; the intermediate amount of noise is caused with the IO user setting information B; and the smallest noise with respect to the number of simultaneously switching signals is caused with the IO user setting information C.

In the present embodiment, the noise (Noise_A) corresponding to the number of pins (a) of the IO user setting information A causing the largest noise with respect to the number of simultaneously switching signals is obtained as the noise from the pins of the IO user setting information A. The difference (Noise_B) between the noise of the caused noise information of the IO user setting information B corresponding to the number (a+b) obtained by adding the number (b) of pins of the IO user setting information B causing the second largest noise with respect to the number of simultaneously switching signals to the number (a) of the pins of the IO user setting information A and the noise of the caused noise information of the IO user setting information B corresponding to the number (a) is obtained as the contribution from the pins of the IO user setting information B. The difference (Noise_C) between the noise of the caused noise information of the IO user setting information C corresponding to the number (=a+b+c) of the pins of the IO user setting information A through C and the noise of the caused noise information of the IO user setting information C corresponding to the number of pins of the IO user setting information A or B being added is obtained as the noise from the pins of the IO user setting information C.

The purpose of using, as the initial point position, the number (a) of pins having the IO user setting information A causing the larger noise with respect to the number of simultaneously switching signals than the IO user setting information B in the above calculation of the contribution from the pins having the IO user setting information B is to reflect the qualitative shapes of the lines of the simultaneously switching signals in the graph in which the lines rise sharply immediately after the origin of the number of simultaneously switching signals, and thereafter the slopes become gradual as the number of simultaneously switching signals increases. By using the initial point position calculated as above, it is possible to better avoid overestimating simultaneous switching noise due to the above sharp increases immediately after the origin than in the method in which the noise corresponding to the number of simultaneously switching signals is obtained from the origin for each set of IO user setting information, and the obtained instances of noise are added while the initial point position is not used.

As shown in FIG. 4, the caused noise information is created in such a manner that it can support all the groups. The calculation of the noise on the basis of the IO setting information as described above is performed for other groups (FIG. 8). In another group, the origin varies depending on the group, and the number of simultaneously switching signals is G in group 2, and the number of simultaneous switching signals in group 3 is G1+G2. The caused noise information may be prepared for each group.

FIG. 5 shows a data configuration of the pin information storage unit shown in FIG. 1B.

As shown in FIG. 5, the arrangement of the respective pins are represented by the numbers in the rows and columns, and together with these numbers (arrangement information), the pin information storage unit 11 shown in FIG. 1B stores the column number and the like. Thereby, it is possible to specify the pins included in the respective groups from the row number and the column number of target pins.

Figure 6:
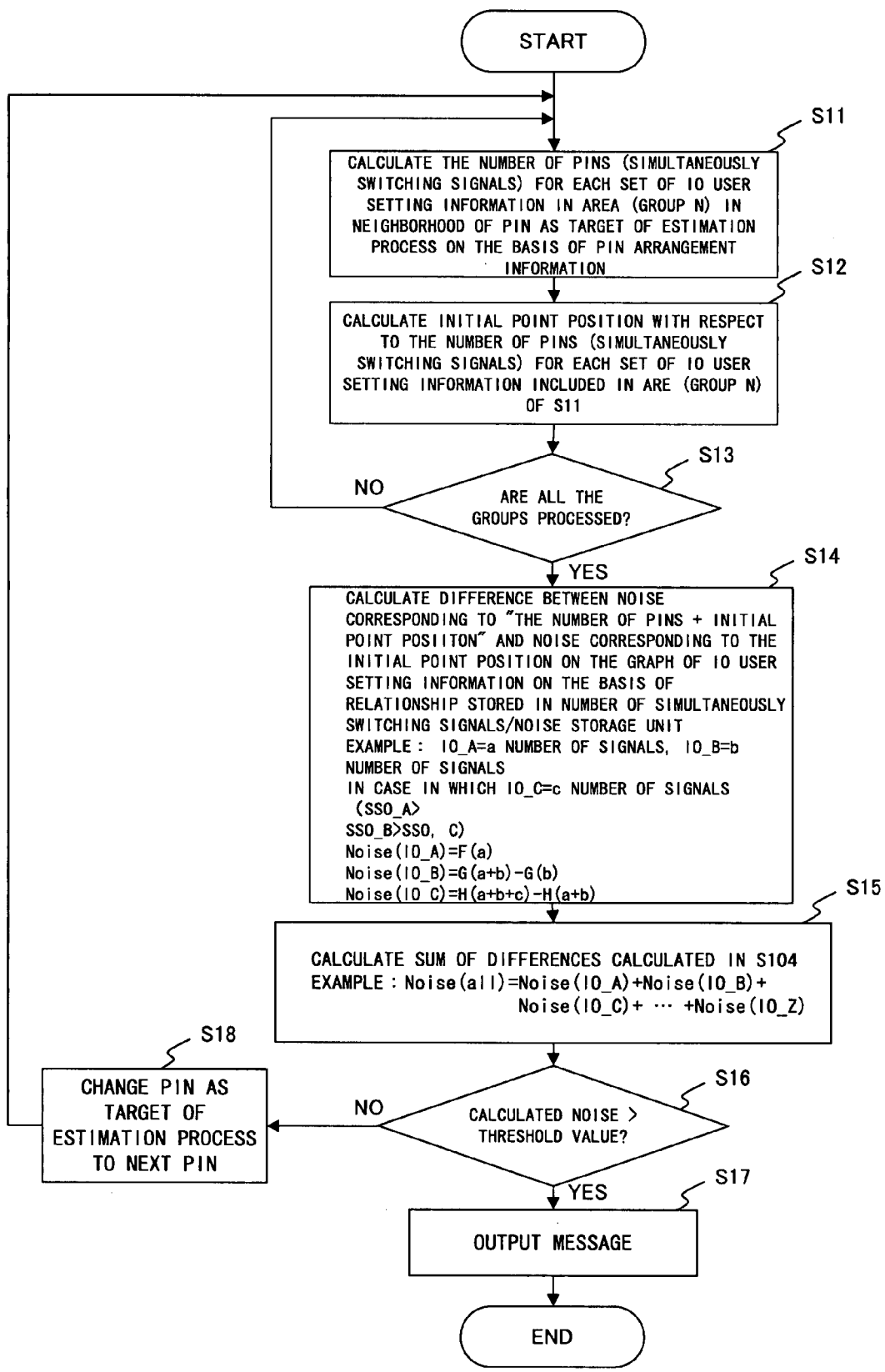
FIG. 6 is a flowchart of the simultaneous switching noise calculation process.

FIG. 6 is a flowchart of the simultaneous switching noise calculation process. This calculation process shows the flows of processes performed in the respective portions that constitute the simultaneous switching noise estimation device 10 shown in FIG. 1B, and is realized by a program causing a computer to execute this flow. The computer includes the program having the functions of the above respective portions. The program is executed for example by specifying the pin information and the caused noise information to be referred to. These pieces of information are stored in a storage device (such as a hard disk device) that a computer can access.

First, in step S11, a process-target pin is selected by referring to the pin information, and the pin information storage unit 11 reads the pin information stored in the computer accessible storage device, obtains the IO user setting information about the pins (pins included in group 1) arranged in the area 22 closest to the pin for which the process is to be executed, and calculates the number of pins for each set of IO user setting information obtained (the number of simultaneously switching signals calculation unit 12₁).

In step s12, for example, the IO user setting information is processed in descending order of the noise with respect to the number of simultaneously switching signals, and the initial point is calculated for each piece of IO user setting information by using the number of pins calculated. Thereby, the initial point position calculation unit 13₁ sets to zero the initial point position corresponding to the IO user setting information with which the larger noise is caused with respect to the number of simultaneously switching signals. The initial point position calculation unit 13₁ also sets each of the other initial point positions to a value obtained by adding, to the number of pins, the initial point positions in the immediately previous IO user setting information that causes a larger noise with respect to the number of simultaneously switching signals.

In step s13, it is determined whether or not all the groups in the neighborhood of the target pin are processed. Here, it is assumed that the areas in the neighborhood of the target pin are categorized into group 1 (the area including the eight pins), group 2 (the area including the sixteen pins), and into group 3 (the area including the twenty four pins). Accordingly, at the current timing, the determination result in step 13 is No, and the process returns to step S11.

In step s11, the pin information stored in the pin information storage unit 11 is read, and the IO user setting information of the pins that are is the second closest to the target pin is arranged in the area 23 from the pin information. Then, for each piece of the obtained IO user setting information, the number of pins is calculated (simultaneously switching signals calculation unit 12₂).

In step s12, the IO user setting information is processed in descending order of the noise with respect to the simultaneously switching signals, and the initial point position is calculated for each piece of IO user setting information by using the calculated number of pins. Thereby, the initial point position calculation unit 13₂ sets the initial point position to the largest value of the number of pins that can be arranged in area 22, which is included in area 23. The initial point position calculation unit 13₁ also sets each of the other initial point positions to a value obtained by adding, to the number of pins, the initial point positions in the immediately previous IO user setting information that causes a larger noise with respect to the number of simultaneously switching signals.

In the subsequent step s13, it is determined that all the groups in the neighborhood of the target pin are not processed, and the process returns to step s11 again.

In step s11, the pin information stored in the pin information storage unit 11 is read, and the IO user setting information of the pins arranged in the area 24 that are the third closest to the target pin is obtained from the pin information. Then, for each of the obtained pieces of IO user setting information, the number of pins is calculated (simultaneously switching signals calculation unit 12₃). In step s12, the initial point position calculation unit 133 processes the IO user setting information of the pins in the area including the twenty-four pins that are the third closest to the target pin in, for example, descending order of the level of noise with respect to the number of simultaneously switching signals, and calculates the initial position by using the number of pins calculated for each piece of IO user setting information. Thereby, the initial point position calculation unit 13₃ sets the initial point position to the largest number of pins that can be arranged in areas 22 and 23, which are within area 24. The initial point position calculation unit 13₁ also sets each other initial point position to a value obtained by adding, to the number of pins, the initial point positions in the immediately previous IO user setting information that causes greater noise with respect to the number of simultaneously switching signals.

In the subsequent step S13, the judgment becomes YES because all the groups in the neighborhood of the target pin are processed, and the process proceeds to step s14.

In step S14, the corresponding caused noise information is referred to by data including the IO user setting information, the number of pins, and the initial position (offset value), and the difference between noise of "the number of pins+initial point position" and the initial point position is calculated (noise calculation unit 15).

Then, in step s15, the simultaneous switching noise in the target pin is calculated by calculating the sum of the differences calculated for the respective groups and IO user setting information in step S14.

In step s16, it is determined whether or not the noise calculated in step s15 is greater than the threshold value that is the toleration limit value. When this is determined to be YES because the calculated noise is greater in step s16, a message such as, for example, "Please change pin arrangement" is output in step s17.

When this is determined, in contrast, to be NO because the calculated noise is equal to or smaller than the threshold value in step S16, the target pin is changed to the next pin in step S18, and the process returns to step s11.

As described above, by changing the target pin to another pin in the semiconductor that is to be analyzed, the simultaneous switching noise in all the pins included in the semiconductor device can be estimated, and it is confirmed whether or not the noise is within the tolerated range.

Figure 7:
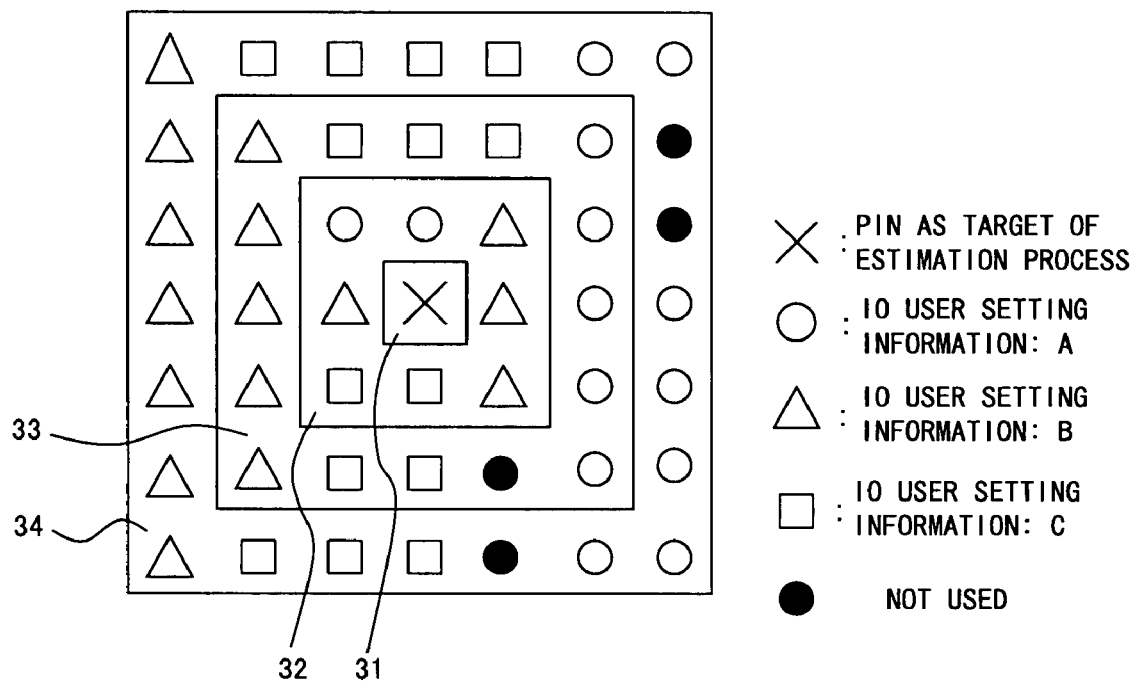
FIG. 7 shows an example of pin arrangement in the neighborhood of the target pin on the FPGA chip.
Figure 8:
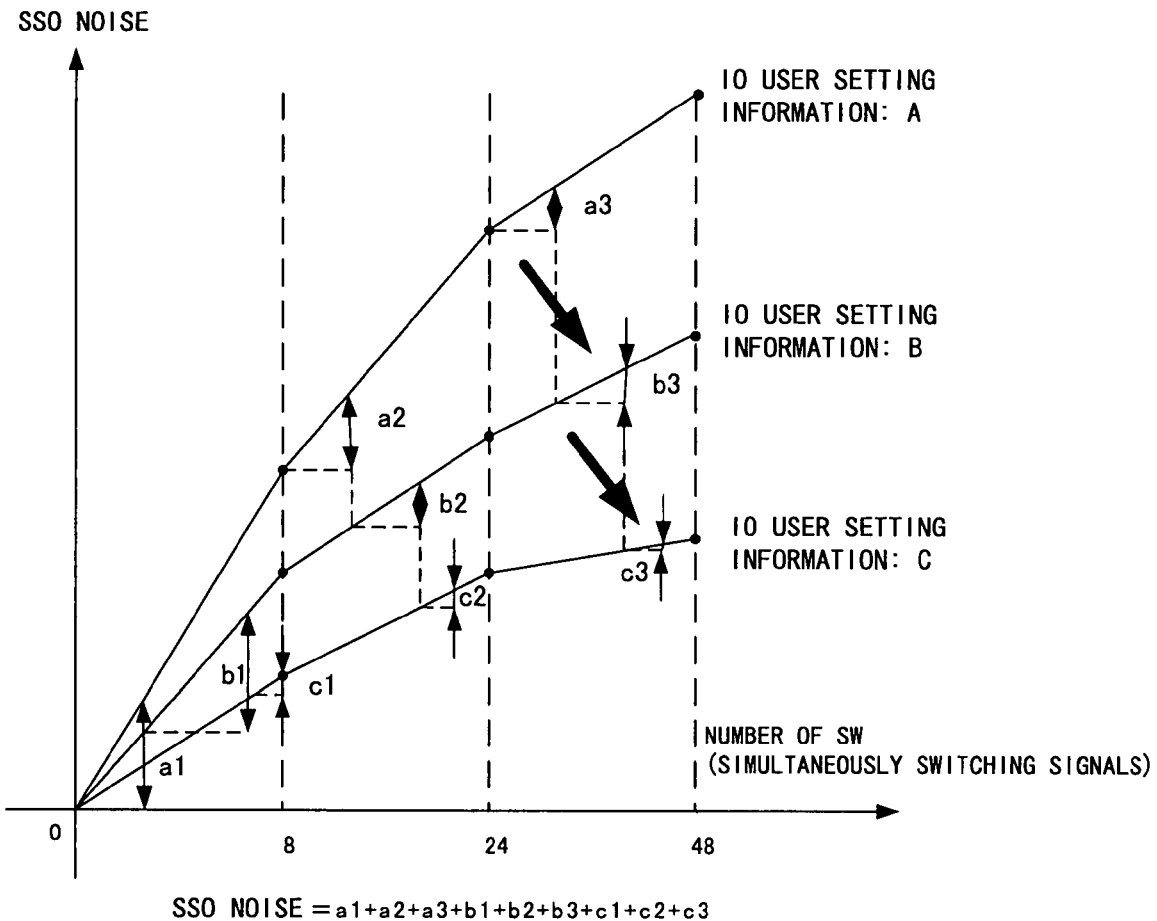
FIG. 8 is a graph illustrating a method of calculating the simultaneous switching noise on the target pin shown in FIG. 7.

FIG. 7 shows an example of pin arrangement in the neighborhood of the target pin on an FPGA chip. FIG. 8 is a graph illustrating a method of calculating the simultaneous switching noise on the target pin shown in FIG. 7.

In FIG. 7, an example is shown of the status in which area 32 including the eight pins (group 1) that are the closest to the area 31 in which the target pin is arranged includes two pins having the IO user setting information A, four pins having the IO user setting information B, and two pins having the IO user setting information C.

In FIG. 7, an example is shown of the status in which area 32 including the sixteen pins (group 2) that are the second closest to area 31 in which the process target pin is arranged includes five pins having the IO user setting information A, five pins having the IO user setting information B, five pins having the IO user setting information C, and one pin that is not used.

In FIG. 7, an example is shown of the status in which area 34 including the twenty-four pins (group 3) that is the third closest to area 31 in which the process target pin is arranged includes seven pins having the IO user setting information A, seven pins having the IO user setting information B, seven pins having the IO user setting information C, and three pins that are not used.

In FIG. 8, the greatest noise with respect to the number of simultaneously switching signals is caused with the IO user setting information A, and the least noise with respect to the number of simultaneously switching signals is caused with the IO user setting information C.

Any of groups 1 through 3 include the pin that has the IO user setting information A that causes the greatest noise for the number of simultaneously switching signals between the three types of IO user setting information (IO user setting information A, IO user setting information B, and IO user setting information C).

In the example illustrated by FIG. 7 and FIG. 8, the value of the IO user setting information, the number of pins, the initial point position, and the corresponding noise in group 1 are expressed as below.

$(A, 2, 0), a1 = F(2+0)(-F(0))$ $(B, 4, 2), b1 = G(4+2) - G(2)$ $(C, 2, 6), c1 = H(2+6) - H(6)$

The value of the IO user setting information, the number of pins, the initial point position, and the corresponding noise in group 2 are expressed as below.

$(A, 5, 8), a2 = F(5+8) - F(8)$ $(B, 5, 13), b2 = G(5+13) - G(13)$ $(C, 5, 18), c2 = H(5+18) - H(18)$

The value of the IO user setting information, the number of pins, the initial point position, and the corresponding noise in group 3 are expressed as below.

$(A, 7, 24), a3 = F(7+24) - F(24)$ $(B, 7, 31), b3 = G(7+31) - G(31)$ $(C, 7, 38), c3 = H(7+38) - H(38)$

In the above equations, X represents the number of simultaneously switching signals, F(X) represents the simultaneous switching noise represented by the caused noise information (function) for the IO user setting information A, G(X) represents the simultaneous switching noise represented by the caused noise information (function) for the IO user setting information B, and H(X) represents the simultaneous switching noise represented by the caused noise information (function) for the IO user setting information C. These elements satisfy the relationship of $F(X) > G(X) > H(X)$.

Then, the noise calculation unit 15 calculates the simultaneous switching noise (SSO) by calculating the sum of the instances of noise (differences) calculated for the respective groups and the sets of IO user setting information on the basis of the equation below.

$$SSO = a1 + a2 + a3 + b1 + b2 + b3 + c1 + c2 + c3$$

Each instance of noise (difference) is calculated in step S14, and the calculation of the simultaneous switching noise by using the equation below is performed in step S15.

The above equation is of the simultaneous switching noise calculated under the pin arrangement shown in FIG. 7. In the case, for example, in which the areas in the neighborhood of the target pin (the area in which the pins to be used for the simultaneous switching noise estimation are arranged) are categorized into N number of areas (groups), and each group includes M number of sets of IO user setting information, the simultaneous switching noise caused in the target pin with the IO user setting information Y included in the group X is represented by Noise_X_Y. In this case, the simultaneous switching noise SSO that the target pin receives from the area around it is expressed by the equation below.

$$SSO = \text{Noise\_1\_1} + \text{Noise\_1\_2} + \ldots + \text{Noise\_1\_}M + \text{Noise\_2\_1} + \ldots + \text{Noise\_}N\_M$$

Figure 9:
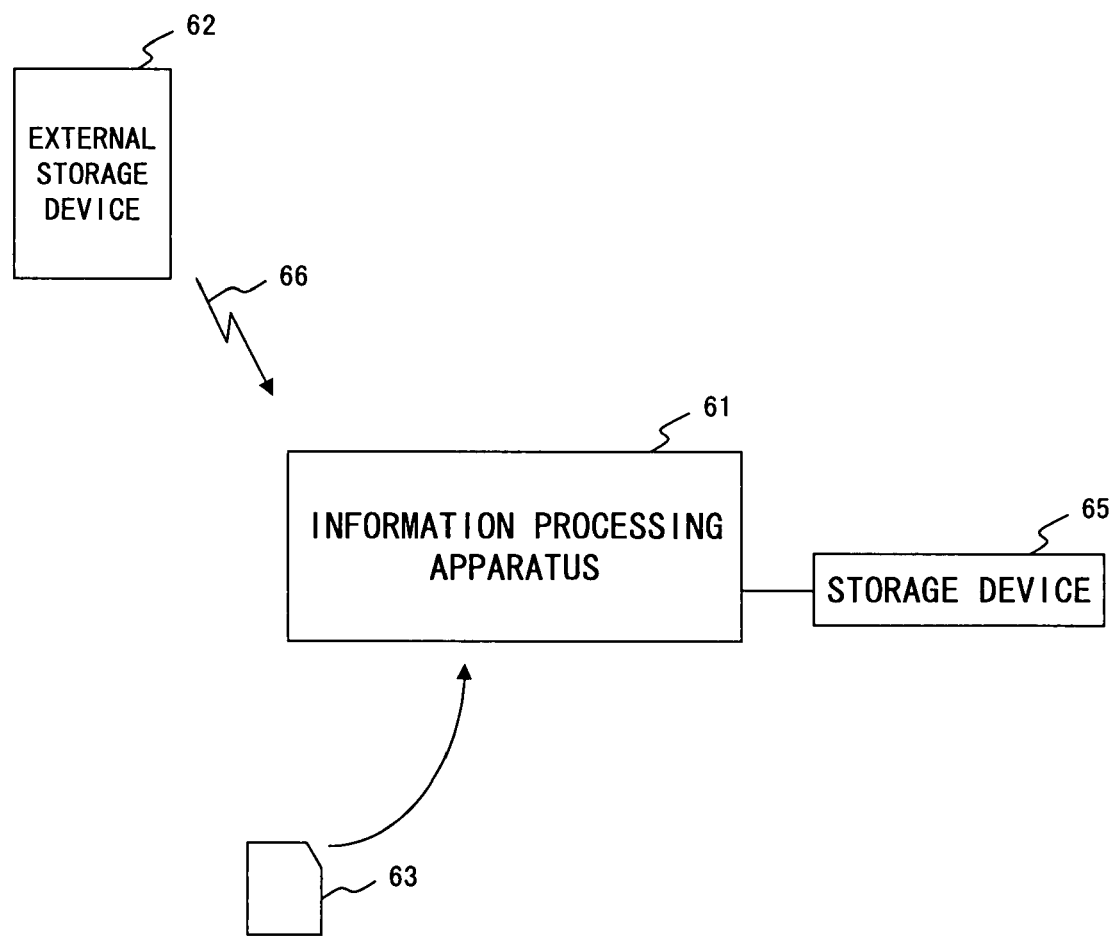
FIG. 9 shows an example of a storage medium.

FIG. 9 shows an example of a storage medium.

The simultaneous switching noise estimation device according to the present invention can be realized by using a computer (information processing apparatus) 61. The computer 61 has devices such as a CPU, a memory input device, a medium driving device, a network connection device, and the like. The program and data having functions of realizing the respective units constituting the simultaneous switching noise estimation device 10 can be executed by being loaded into memory in the computer 61 from a storage device 65, can be executed by being loaded into the medium driving device from a transportable storage medium 63, and also can be executed by being received by the network connection device via a network 66 from an external storage device 62.

The present invention can be widely applied to semiconductor devices such as an ASIC and the like even though the above embodiment has been explained by using the example of the FPGA.

Third Embodiment

Figure 10A:
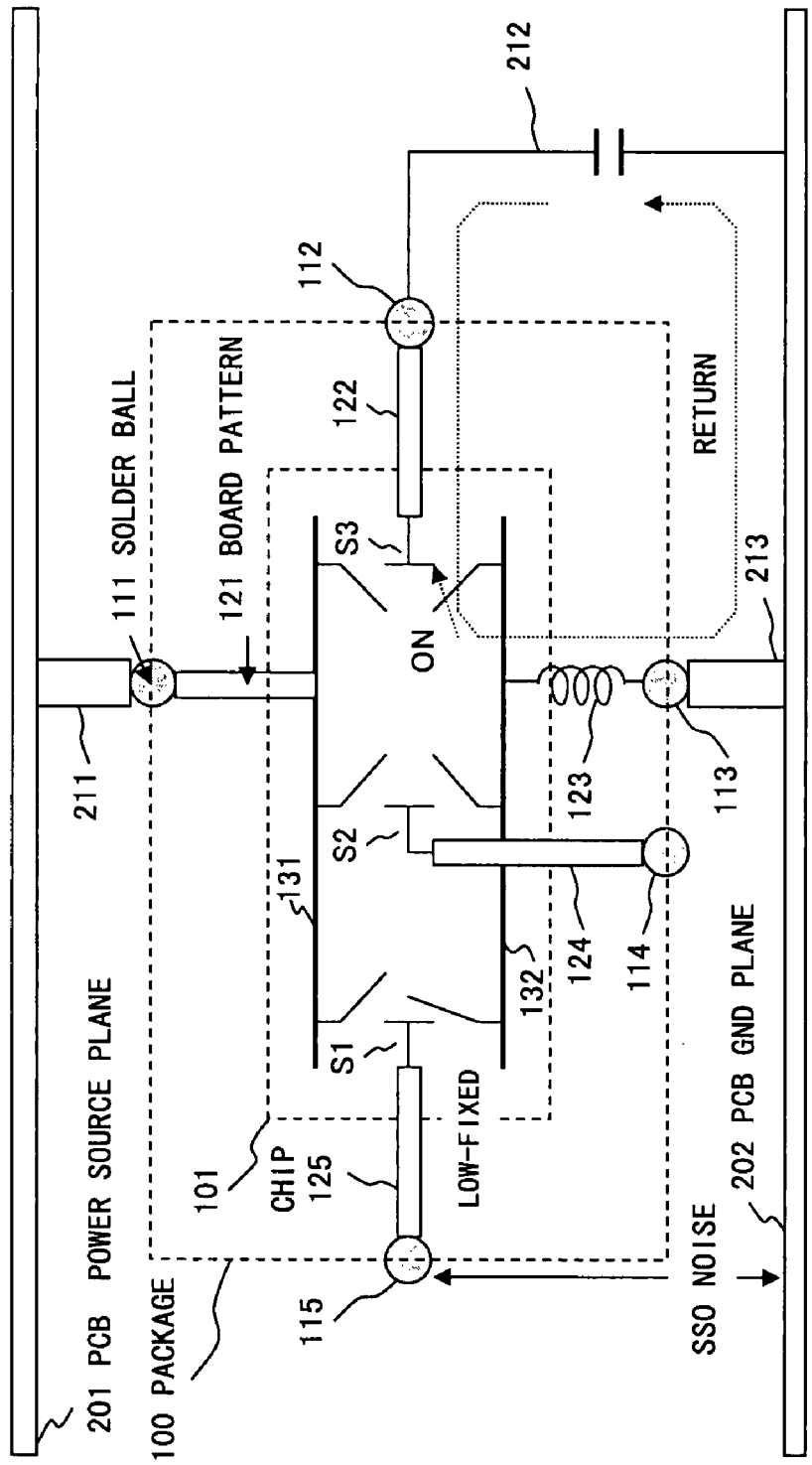
FIG. 10A shows an electric current flowing between PCBs and a semiconductor device.
Figure 10B:
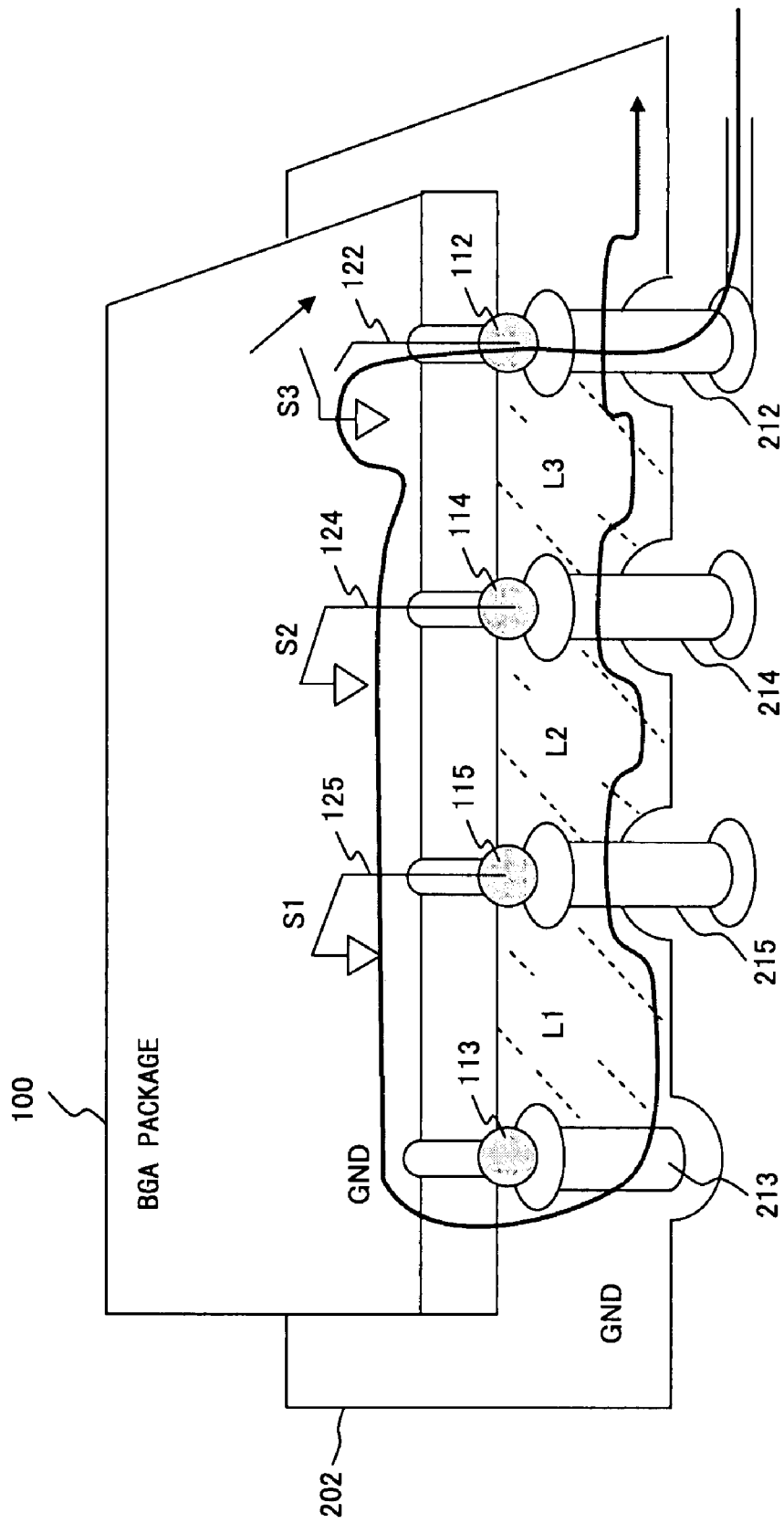
FIG. 10B shows a space in which a magnetic flux is generated by a return current that is caused to flow by the provision of an IO signal to a pin.

FIG. 10A shows an electric current flowing between the PCBs and a semiconductor device. FIG. 10B shows a space in which a magnetic flux is generated by a return current that is caused to flow by the provision of an IO signal to a pin. By referring to FIGS. 10A and 10B, the mechanism of generating the simultaneous switching noise is explained.

As shown in FIG. 10, a BGA (Ball Grid Array) package 100 that is a semiconductor device is connected between a power source plane 201 and a ground plane 202 of the PCB. The power source plane 201 is connected to a power source pattern 131 via a board pattern 211 on the PCB side, a solder ball 111, and a board pattern (bonding wire) 121 on the package 100 side. The ground plane 202 is connected to the ground pattern 132 of the chip 101 via the board pattern 213, the solder ball 113, and the board pattern (bonding wire) 123.

Symbols S1 through S3 in FIGS. 10A and 10B are switches respectively provided on the chip 101. The respective switches S1 through S3 respectively control the flows of current between the power source pattern 131 and the ground pattern 132. The terminals used for the control are respectively connected to the solder balls 112, 114 and 115 via the board pattern 122, 124 or 125. The respective solder balls 111 through 115 respectively exist for each pin.

The above coupling degree (coupling coefficient) corresponds to the target pin, and is generally equal to the coupling inductance of the return current path of a pin that causes the noise for the pin (corresponding to a pin included in any of the groups; hereinafter this pin is referred to as "noise causing pin" for simplicity). The magnitude depends on the arrangement of the target pin/noise causing pin on the package 100, the board patterns that are respectively connected to these pins, the positions of the switches respectively connected via the board patterns on the chip 101, the arrangement of the pins for the power/ground on the package 100, the board patterns respectively connected to the pins, and positions of the connections between the board patterns on the chip 101.

Here, it is assumed that the target pin and the switch S1 are connected to each other and that the noise causing pin is connected to the switch S3. On this assumption, when the switch S3 is switched from High to Low and a line between the board pattern 122 and the ground pattern 132 is made to be in a conductive state, a path (closed loop circuit) is formed which consists of the board pattern 212, the solder ball 112, the board pattern 122, the switch S3, the ground pattern 132, the board pattern 123, the solder ball 113, the board pattern 213, and the ground plane 202 as indicated by the dashed line. The transient current (return current) flows in that path. As shown in FIG. 10B, the spaces L1 through L3 that constitute the path become magnetic regions in which magnetic fields are generated. When the target pin is connected to the switch S1, the coupling inductance of the return current path is in direct proportion to the magnetic flux amount generated in the space L1. When the pin is connected to the switch S2, the coupling inductance of the return current path is in direct proportion to the magnetic flux amount generated in the space L1+L2. The number of fluxes in the space L1+L2 is greater than that in the space L1; accordingly, a greater noise is caused when the target pin is connected to the switch S2. As described above, the coupling coefficient (coupling inductance) is in direct proportion to the area size of the space formed by the return current path, and the magnetic flux amount generated is in direct proportion to the area size.

In view of the above characteristics, in the third embodiment, the return current path is analyzed by the actual measurement or the simulation, and grouping is performed for the pin (noise causing pin) that is the target pin and also is the pin used for the estimation of the simultaneous switching noise. This grouping is performed by preparing, for each target pin, differentiation information (for example, arrangement information) used for specifying pins included in the respective groups and by referring to prepared information. The caused noise information is used for each group similarly in the first and second embodiments. By performing this grouping, it is possible to accurately estimate the simultaneous switching noise.

The simultaneous switching noise calculation process performed for estimating the noise is fundamentally the same as that of the second embodiment except that the method for specifying the pins included in the respective groups is different. Therefore, the configuration of the simultaneous switching noise estimation device is also fundamentally the same as that in the second embodiment. Accordingly, the detailed explanation thereof is omitted.

The package 100/substrate board pattern is much larger and more dominant than the pattern formed on the chip 101. Accordingly, the amount of noise caused is mainly determined by the arrangement of the pins on the package 100. Accordingly, in the first and second embodiment, the grouping is performed on the basis of the arrangement of the pins. Therefore, in FIG. 10B, the dashed slants that represent the area of the spaces L1 through L3 are shown only in the ground plane 202.

Fourth Embodiment

The above first through third embodiments all employ a configuration in which the simultaneous switching noise is estimated on the assumption that the pin to which the IO user setting information is assigned causes the noise. In contrast, in a fourth embodiment, the pins that can be neglected are not used for the estimation in order to perform more accurate estimation of the simultaneous switching noise.

FIG. 11 shows a grouping method according to the fourth embodiment.

As shown in FIG. 11, in the fourth embodiment, pins are categorized in accordance with the IO user setting information, and also the pins are categorized in accordance with the phases of the IO signals that are input and output on the basis of the IO user setting information. The IO signals can be roughly categorized into three types. The first type is signal that change being in phase with the IO signal input into and output from the target pin (effective edges are synchronous). The second type is signal that change not being in phase with the IO signal input into and output from the target pin (the effective edges are not synchronous; here it is called "opposite phase"). The third type is signal that change being asynchronously.

Among the above three types, the signals that change being in phase and the signals that change being asynchronously can be proven to cause noise in the target pin while the signals that change being out of phase cannot be proven to cause noise in the target pin. Accordingly, the pins used for inputting and outputting the IO signals that change being out of phase are not used for the estimation of the simultaneous switching noise in order to avoid the overestimation of the (amount of) noise. Thereby, it is possible to estimate the noise more accurately.

The above grouping can be performed by preparing phase information of the IO signals that are input into and output from each pin used for the estimation of the simultaneous switching noise or by preparing the phase information of the IO signals for each pin. The simultaneous switching noise calculation process executed for estimating the noise is fundamentally the same as in the second embodiment except for the method of specifying the pins included in the respective groups. Therefore, the configuration of the simultaneous switching noise estimation device is the same as that in the second embodiment. Accordingly, a detailed explanation thereof is omitted.

It is possible to cope with to the simultaneous switching noise that is caused by the input and output of the IO signals to other pins by changing the design of the semiconductor device (change in the pin arrangement). However, this measure can be realized by changing the design of the PCB, specifically by changing the arrangement of the power circuit on the device or by changing the number of power circuits on the device, and the like. Thereby, the reaction in which the semiconductor device and the PCBs that include the semiconductor device are both taken into consideration (associated reaction) is realized. Thereby, as shown in the flowchart of FIG. 12, it is possible to develop the semiconductor device and the PCBs while handling these elements as one product (device).

In that case, first, specifications of the device (product) constituted by the semiconductor device and the PCB including the semiconductor device are determined (S101). Next, on the basis of the determined specifications, a required LSI (Large Scale Integration) is identified, and mapping is performed to determine whether the identified LSI is to be included in the semiconductor device or the PCB (S102). After performing the mapping, specifications of the interface are determined between the semiconductor device and the PCBs, and between the PCBs and the external devices (S103). Thereafter, the design of the semiconductor device and the PCBs proceed respectively.

For the semiconductor device, first, fundamental specifications are determined (S201). Thereafter, the functional design (S202) reflecting the result of S102 and S103 is performed. After performing the functional design, the determination of the pin arrangement (S203), the wiring design (S204) based on the determined pin arrangement, and the timing verification (S205) for verifying whether or not the device appropriately operates are performed in this order. When it is verified that the device operates accurately by the timing verification, the LSI (semiconductor device) production phase (S206) starts. When a fault or the like is detected in S204 or S205, the previous phase starts again in order to change the design.

The fundamental design of the PCBs is performed while taking into consideration the results of S102 and S103, and the size, type, and the like of the PCBs are determined (S301). Thereafter, the arrangement of the LSIs (power circuit and connectors to connect the semiconductor device) to be included in the PCBs are determined (S302), and the wire connection based on the determined arrangement is determined (S303).

The simultaneous switching noise to be estimated may change depending on the pin arrangement, the wiring based on the arrangement, and the arrangement of LSIs on the PCBs. Accordingly, the SSN check is performed on the semiconductor device when the designing of S203 and S204 is completed and on the PCBs when the LSI arrangement in S302 is determined. The SSN check is a check of whether or not simultaneous switching noise estimated for each pin is within the tolerated range (S401). If the check result indicates that there is a pin that causes simultaneous switching noise that is out of the tolerated range, the phase before the checking or one of the other phases starts, and a design change, a pin arrangement change, or a wiring change is performed to react to this fault. Also, if the phase in which a fault is detected is in S302, it is possible to change the design such as the LSI arrangement.

If the above method of using flexible design phases is used for another device (a semiconductor device or a PCB), it is possible to react more flexibly. Thereby, it is possible to start the production of the entirety more speedily. For example, a case in which it is difficult to change the arrangement of the LSIs in S302 can be handled flexibly such as by changing the pin arrangement in S203, changing the wire arrangement in S204, or the like. It is also possible to optimize the latter while taking the former into consideration. Thereby, it is possible to facilitate flexible and appropriate designing.

When the timing verification in S205 and the wire connection between the LSIs in S303 are performed, a timing verification is performed for verifying whether or not signals can be transmitted and received appropriately via the external interface. When a fault is not detected in this verification, the production of the semiconductor device in S206 or the production of the PCB in S304 starts. After these production steps, the production of a device including the semiconductor device on the PCB is started (S104).

What is claimed is:

1. A method of estimating simultaneous switching noise that is caused by simultaneously switching an input/output signal of a plurality of pins in a semiconductor device, the method being realized by using a computer executing a process of:

obtaining a number of simultaneous switching signals of a first input/output signal and a number of simultaneous switching signals of a second input/output signal by using pin information that the plurality of pins in the semiconductor device are associated with user setting information for determining the input/output signal for each of the pins;

obtaining a first noise value corresponding to a number A of simultaneous switching signals of the first input/output signal using a first user setting information that cause the largest noise, a second noise value corresponding to a number A+B obtained by adding noise cause by a number B of switching signals of the second input/output using a second user setting information causing the second largest noise and the noise of the number A of simultaneous switching signals of the first input/output signal using the second user setting information;

calculating a difference between the noise value corresponding to the number A+B of simultaneous switching signals and the noise value corresponding to the number A of simultaneous switching signals of the second input/output signal as a simultaneous switching noise value of the second input/output signal by using the noise information;

calculating a sum of the noise value corresponding to the number A of simultaneous switching signals of the first input/output signal and the simultaneous switching noise value of the second input/output signal as an estimate of simultaneous switching noise of a pin in the semiconductor device;

comparing the estimate of simultaneous switching noise with a threshold;

outputting a message when the estimate of simultaneous switching noise is greater than the threshold; and wherein pins arranged in a neighborhood of a process-target pin are categorized into a plurality of groups, and the numbers of the simultaneously switching signals are obtained respectively in the obtaining the number of simultaneous switching signal;

the difference calculation is executed, for each group of the simultaneously switching signals obtained for each set of user setting information; and simultaneous switching noise is calculating a sum of the difference obtained for each set of user setting information and for each group in the noise sum calculation.

2. The method of estimating a simultaneous switching noise according to claim 1, wherein:

the difference is calculated for each set of said user setting information included in one group in descending order of noise with respect to the number of simultaneously switching signals in the difference calculation;

an initial point in the range is set to zero for the user setting information with which the largest noise is caused with respect to the number of the simultaneously switching signals from among a plurality of sets of user setting information included in an innermost group from among the plurality of groups;

a maximum value of the number of the simultaneously switching signals assigned to all of the inner groups is calculated as an initial point in the range for the user setting information with which a greatest noise is caused with respect to the number of the simultaneously switching signals from among a plurality of sets of user setting information included in groups other than the innermost group from among the plurality of groups; and a terminal point in a range used for calculating noise with immediately previous user setting information with which a larger noise is caused with respect to the number of simultaneously switching signals than with the user setting information included in each group is calculated as the initial point in the range.

3. The method of estimating a simultaneous switching noise according to claim 1, wherein:

pins arranged in the area in the neighborhood are categorized into a plurality of groups on the basis of one of arrangement of the pins and on the basis of a coupling coefficient between the pins in the obtaining the number of simultaneous switching signals step.

4. The method of estimating a simultaneous switching noise according to claim 3, wherein:

the number of said simultaneously switching signals is calculated for each group and for each set of user setting information by differentiating the pins on the basis of phases of input/output signals input into and output from the pins arranged in the area in the neighborhood in accordance with the user setting information in the number of simultaneously switching signals calculation step; and in the difference calculation step, the difference is calculated on the basis of the number of simultaneously switching signals calculated for each group and for each set of said user setting information in the number of simultaneously switching signals calculation step.

5. The method of estimating a simultaneous switching noise according to claim 1, wherein:

the noise caused by the simultaneous switching of signals in the noise information in each of the sets of user setting information is noise caused in the case when all the pins included in one group and in groups closer to the process-target pin than this group commonly have prescribed user setting information for each group and switch simultaneously on the basis of the commonly acquired user setting information.

6. The method of estimating a simultaneous switching noise according to claim 1, wherein:

the user setting information is differentiating information used to differentiate combinations of a standard of the input/output signal, an output current value, and a through rate.

7. The simultaneous switching noise estimation method according to claim 1, wherein:

when there are a plurality of sets of the user setting information for setting the input/output signals:

the number of the simultaneously switching signals is calculated for each set of the user setting information; and the noise is calculated for each set of the user setting information by referring to the noise information stored in a storage unit for each of piece of the user setting information, and the simultaneous switching noise is calculated by integrating the calculated noise.

8. The simultaneous switching noise estimation method according to claim 1, wherein:

a target pin and other pins are categorized into a plurality of groups, and the number of simultaneously switching signals is calculated for each of the groups;

the noise is calculated for each of the groups by referring to the noise information stored in a storage unit for each of the groups, and the simultaneous switching noise is calculated by integrating the calculated noise.

9. A non-transitory storage medium that accessed by a computer performing a process of estimating simultaneous switching noise caused by simultaneous switching of input/output signals of a plurality of pins in a semiconductor device, said storage medium recording a program for:

obtaining a number of simultaneous switching signals of a first input/output signal and a number of simultaneous switching signals of a second input/output signal by using pin information that the plurality of pins in the semiconductor device are associated with user setting information for determining the input/output signal for each of the pins;

obtaining a first noise value corresponding to a number A of simultaneous switching signals of the first input/output signal using a first user setting information that cause the largest noise, a second noise value corresponding to a number A+B obtained by adding noise cause by a number B of switching signals of the second input/output using a second user setting information causing the second largest noise and the noise of the number A of simultaneous switching signals of the first input/output signal using the second user setting information;

calculating a difference between the noise value corresponding to the number A+B of simultaneous switching signals and the noise value corresponding to the number A of simultaneous switching signals of the second input/output signal as a simultaneous switching noise value of the second input/output signal by using the noise information;

calculating a sum of the noise value corresponding to the number A of simultaneous switching signals of the first input/output signal and the simultaneous switching noise value of the second input/output signal as an estimate of simultaneous switching noise of a pin in the semiconductor device;

comparing the estimate of simultaneous switching noise with a threshold;

outputting a message when the estimate of simultaneous switching noise is greater than the threshold; and wherein pins arranged in a neighborhood of a process-target pin are categorized into a plurality of groups, and the numbers of the simultaneously switching signals are obtained respectively in the obtaining the number of simultaneous switching signal;

the difference calculation is executed, for each group of the simultaneously switching signals obtained for each set of user setting information; and simultaneous switching noise is calculating a sum of the difference obtained for each set of user setting information and for each group in the noise sum calculation.

10. The storage medium according to claim 9, wherein:
pins arranged in the area in the neighborhood are categorized into a plurality of groups on the basis of one arrangement of the pins and a coupling coefficient between the pins in the obtaining the number of simultaneous switching signals.

11. The storage medium according to claim 9, wherein:
the noise caused by the simultaneous switching of signals is noise caused in the case when all the pins included in one group and in groups closer to the process-target pin than this group commonly have prescribed user setting information for each group in the noise information and are switching simultaneously on the basis of the commonly acquired user setting information.

12. The storage medium according to claim 9, wherein:
the user setting information is differentiating information used for differentiating combinations of a standard of the input/output signal, an output current value, and a through rate.

13. A simultaneous switching noise estimation device that executes a process of estimating the simultaneous switching noise caused by the simultaneous switching of signals input into and output from a plurality of pins in a semiconductor device, comprising:

a storage unit to store pin information that associates the plurality of pins in the semiconductor device with user setting information for determining the input/output signal for each of the pins, and to store noise information that includes data indicating a relationship between a number of simultaneous switching signals and a noise value of simultaneous switching noise caused by a first input/output signal causing largest noise and that includes data indicating a relationship between a number of simultaneous switching signals and a noise value of simultaneous switching noise caused by second input/output signal causing second-largest noise;

obtain unit to obtain a number A of simultaneous switching signals of the first input/output signal using a first user setting information, a number A+B of simultaneous switching signals obtained by adding a number B of switching signals of the second input/output using a second user setting information and the number A of simultaneous switching signals of the first input/output signal using the second user setting information;

a calculation unit to obtain a simultaneous switching noise value of the first input/output signal from a first noise value corresponding to the number A of simultaneous switching signal of the first input/output signal, a second noise value corresponding to the number A+B using the noise information, and to calculate a difference between the noise value corresponding to the number A+B and the noise value corresponding to the number A of simultaneous switching signals of the second input/output signal as simultaneous switching noise value of the second input/output signal by using the noise information;

a noise sum calculation unit to calculate a sum of the simultaneous switching noise value of the first input/output signal and the simultaneous switching noise of the second input/output signals as am estimate of simultaneous switching noise of a pin in the semiconductor device;

wherein the obtain unit categories pins arranged in neighborhood of a process-target pin into a plurality of groups, and calculate the numbers of simultaneously switching signals respectively;

the difference calculation is executed, for each group of the simultaneously switching signals obtained for each set of user setting information; and simultaneous switching noise is calculated by calculating a sum of difference obtained for each set of user setting information and for each group in the noise sum calculation.

14. The simultaneous switching noise estimation device according to claim 13, wherein:
pins arranged in the area in the neighborhood are categorized into a plurality of groups on the basis of one arrangement of the pins and a coupling coefficient between the pins in the number of simultaneously switching signals calculation unit.

* * * * *